United States Patent [19]
Wu

[11] Patent Number: 6,117,768
[45] Date of Patent: *Sep. 12, 2000

[54] VOID-FREE TUNGSTEN-PLUG CONTACT FOR ULSI INTERCONNECTION

[76] Inventor: Shye-Lin Wu, No. 6, Creation Rd.2, Science-Based Industrial Park, Hsinchu, Taiwan

[*] Notice: This patent is subject to a terminal disclaimer.

[21] Appl. No.: 09/099,705

[22] Filed: Jun. 19, 1998

[51] Int. Cl.[7] .............................................. H01L 21/4763
[52] U.S. Cl. ...................... 438/648; 438/649; 438/651; 438/653; 438/656; 438/660; 438/663; 438/672; 438/675; 438/775
[58] Field of Search ..................... 438/233, 649, 438/653, 648, 651, 656, 660, 663, 672, 675, 775

[56] References Cited

U.S. PATENT DOCUMENTS

| | | | |
|---|---|---|---|
| 5,554,565 | 9/1996 | Liaw et al. | 437/192 |
| 5,899,741 | 5/1999 | Tseng et al. | 438/649 |

*Primary Examiner*—David Hardy
*Assistant Examiner*—José R Diaz
*Attorney, Agent, or Firm*—Harness, Dickey & Pierce, P.L.C.

[57] ABSTRACT

A doped oxide and an undoped oxide are formed on a substrate. Then, the substrate is annealed to re-flow the doped oxide layer. The doped oxide is then etched back. Next, a contact hole is created by etching. An amorphous silicon layer is formed on the surface of the doped oxide layer and along the surface of the contact hole. Next, high temperature is used to recover the etching damage and simultaneously transform or convert the amorphous silicon into a polysilicon layer. A titanium layer and a titanium nitride are respectively formed onto the polysilicon layer. Next, rapid thermal process (RTP) is introduced to form a titanium silicide beneath the titanium nitride layer. A tungsten layer is formed on the titanium nitride layer and refilled into the contact hole. The tungsten layer is then etched back to form a tungsten plug with void-free in the contact hole. A conductive layer is formed on the titanium nitride layer. The titanium silicide, titanium nitride layer and the conductive layer are patterned to define a metal line.

17 Claims, 4 Drawing Sheets

VOID-FREE TUNGSTEN-PLUG CONTACT FOR ULSI INTERCONNECTION

FIELD OF THE INVENTION

The present invention relates to a method of fabricating integrated circuits, and more specifically, to a method of making a void-free interconnection for semiconductor devices.

BACKGROUND OF THE INVENTION

The large integration of semiconductor ICs has been accomplished by a reduction in individual device size. With this reduction of device size, many challenges arise in the manufacture of the ICs. Each device requires interconnections for exchanging electrical signals from one device to another device. Using the DRAM as an example, the word line and the bit line for a memory cell serve as interconnections. Connections between metal layers are constructed by filling a conductive plug in a via hole formed in an isolation layer. The conductive material chosen for the contact must have a low work function as well as a low electron resistivity. Aluminum, tungsten, titanium and copper are candidates for the contact metal material. The technology of forming effective contacts have met obstacles due to miniaturization of the device to sub-micron range. The advanced method to form the contact is the use of the tungsten plug technique. In short, the tungsten is filled in a contact hole in a dielectric layer. The tungsten features the benefit of low resistivity and can be formed at a temperature lower than 500 degrees centigrade by chemical vapor deposition.

Typically, a planarizaion process is needed after the PMD (pre-metal dielectric) layer is formed. A. Tissier has mentioned many methods of planarizaion for pre-metal and metal level layer in "Proceeding on Advanced Metallization for ULSI Application", p.341, 1994. The BPSG film has been widely used as the pre-metal dielectric (PMD) to achieve global planarization for advanced ULSI devices. However, the high temperature anneal that is performed after opening the contact hole will induce the BPSG film to re-flow, thus an overhang structure will be generated at the top of the contact hole. The issue has been mentioned in U.S. Pat. No. 5,554,565. In U.S. Pat. No. 5,364,817, a method is disclosed to provide an effective method of metallization with improved step coverage and reduced electromigration problem.

A further prior method may cause a void in a conductive layer due to bad step coverage. The general processes become more challenging as the spacing between the metal interconnections further shrink. A void may often be formed between the interconnections. Thus, what is required is a void-free method for making the interconnection.

SUMMARY OF THE INVENTION

The object of the present invention is to form a void-free tungsten plug. A doped oxide is deposited onto an undoped oxide. Then, the substrate is annealed to re-flow the doped oxide layer, thereby planarizing its upper surface. The doped oxide layer is then etched back to reduce the thickness. A photoresist is then patterned on the top surface of the doped oxide. Next, the doped oxide is etched using the photoresist as a mask to create contact hole. An amorphous silicon layer is formed on the surface of the doped oxide layer and along the surface of the contact hole. Next, high temperature is used to recover the etching damage and simultaneously transform or convert the amorphous silicon into a polysilicon layer. A titanium layer and a titanium nitride are respectively formed onto the polysilicon layer. Next, rapid thermal process (RTP) is introduced to react the titanium with the polysilicon layer, thereby forming a titanium silicide beneath the titanium nitride layer. A tungsten layer is formed on the titanium nitride layer and refilled into the contact hole by using the tungsten hexafluoride and hydrogen. The tungsten layer is then etched back to expose the titanium nitride layer, thereby forming a tungsten plug void-free in the contact hole. A conductive layer is formed on the titanium nitride layer. The titanium silicide, titanium nitride layer and the conductive layer are patterned to define the metal line.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of making a tungsten plug contact for interconnections, while generally preventing the formation of voids. As will be seen below, these techniques can be used to create an interconnection without voids.

Figure 1:
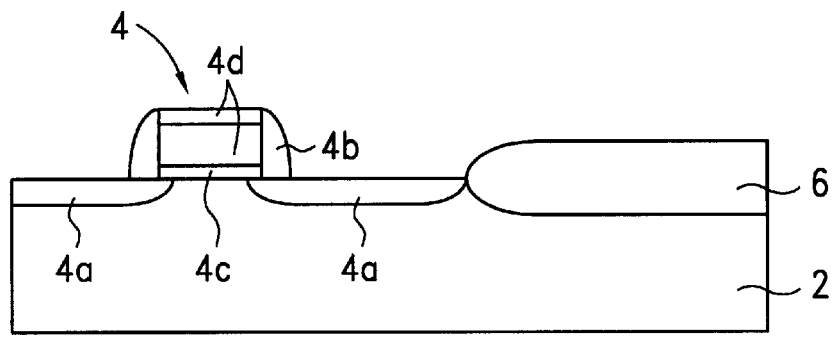
FIG. 1 is a cross-sectional view of a semiconductor wafer illustrating the step of forming transistor on a semiconductor substrate in accordance with the present invention.
Figure 2:
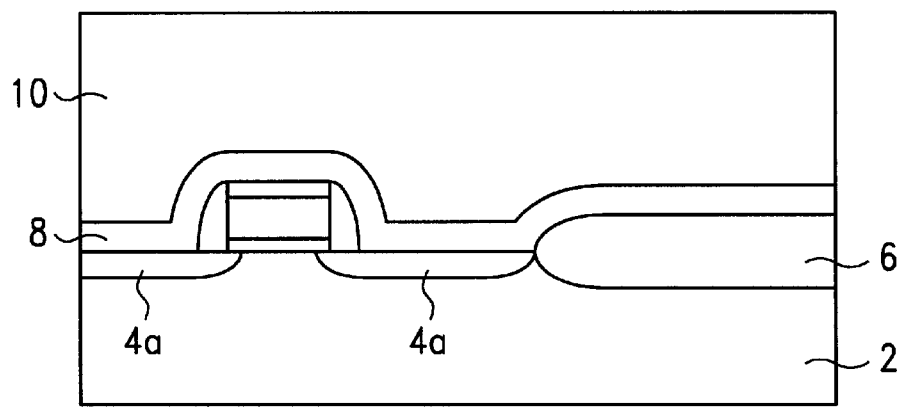
FIG. 2 is a cross-sectional view of a semiconductor wafer illustrating the steps of forming a doped oxide and an undoped oxide on a semiconductor substrate in accordance with the present invention.

Turning to FIG. 1, a single crystal silicon substrate 2 with a <100> crystallographic orientation is shown. Within the substrate 2 may be formed one or more semiconductor devices. The particular devices or their functions are not particularly germane to the present invention. However, the interconnections between these devices are the subject of the present invention. Using a metal oxide semicondutor (MOS) transistor as an example, the MOS transistor 4 includes silicide/polysilicon gate electrode 4d, gate insulator 4c, spacer 4b and source/drain region 4a or named 'active region' is formed on the substrate adjacent to the isolation structure 6, such as field oxide (FOX). The MOS 4 and the FOX 6 can be formed by conventional standard processes. An undoped oxide 8 such as TEOS-oxide, none-doped silicon glass (NSG) or the like is formed over the substrate 2, the MOS 4 and the FOX 6. The TEOS-oxide 8 can be formed by using low-pressure chemical vapor deposition (LPCVD) or plasma-enhanced chemical vapor deposition (PECVD). The layer 8 is formed by the thermal decomposition of thtraethylorthosilicate, as shown in FIG. 2. A layer 10 of doped oxide is deposited onto the undoped oxide 8 using chemical vapor deposition. The BPSG can be used to serve as the doped oxide 10. The thickness of the BPSG layer is about 2000 to 12000 angstroms.

Figure 3:
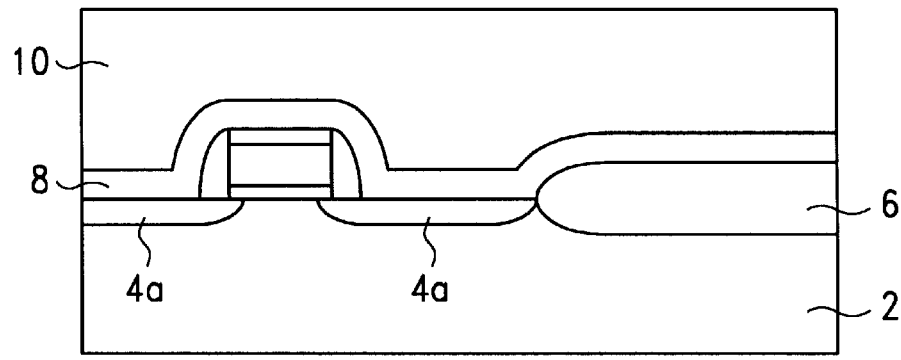
FIG. 3 is a cross-sectional view of a semiconductor wafer illustrating the step of performing thermal anneal in accordance with the present invention.

Turning to FIG. 3, after the BPSG is formed, the substrate 2 is annealed at about 750 to 1000 degrees centigrade to re-flow the BPSG layer 10, thereby planarizing its upper surface. The BPSG layer 10 is then etched back to reduce the thickness.

Figure 4:
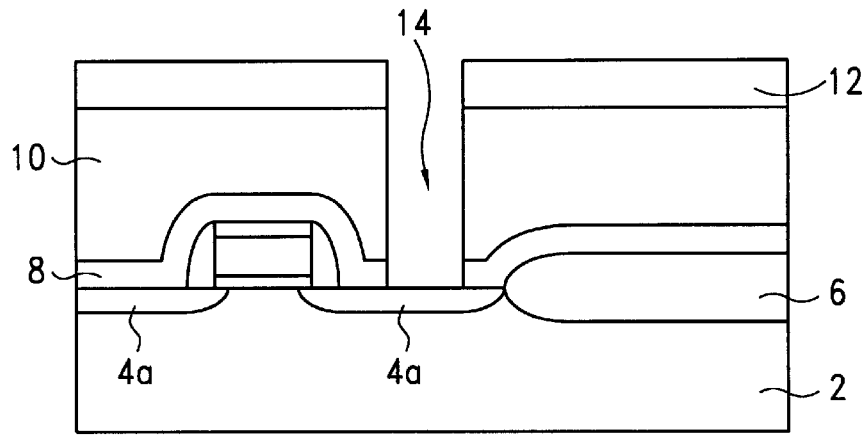
FIG. 4 is a cross-sectional view of a semiconductor wafer illustrating the step of forming a contact hole in accordance with the present invention.
Figure 5:
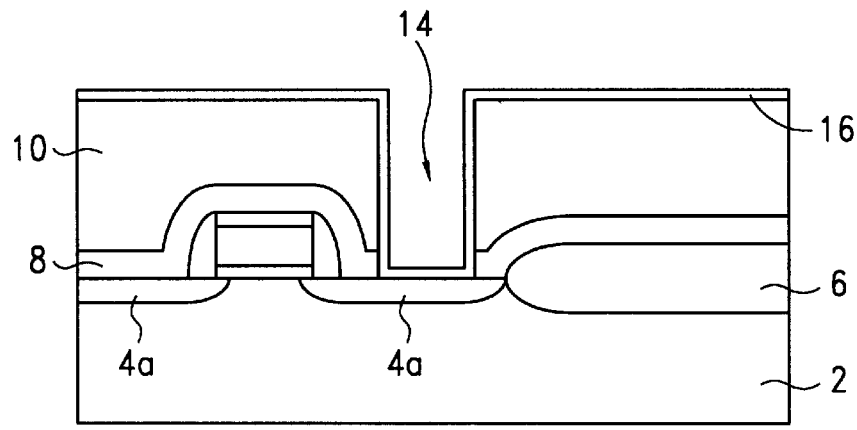
FIG. 5 is a cross-sectional view of a semiconductor wafer illustrating the step of forming an amorphous silicon layer in accordance with the present invention.

Referring to FIG. 4, a photoresist 12 is then patterned on the top surface of the BPSG layer 10. Next, the layer 10 is etched using the photoresist 12 as a mask to create contact hole 14 in the layer 10, thereby exposing the active region 4a (source and drain) of the MOS 4. The etching is performed with high etch-rate ratios as well as end-point detection. The photoresist 12 is removed. Turning to FIG. 5, an amorphous silicon layer 16 having 10 to 50 nm thick is formed on the surface of the BPSG layer 10 and along the surface of the contact hole 14.

Figure 6:
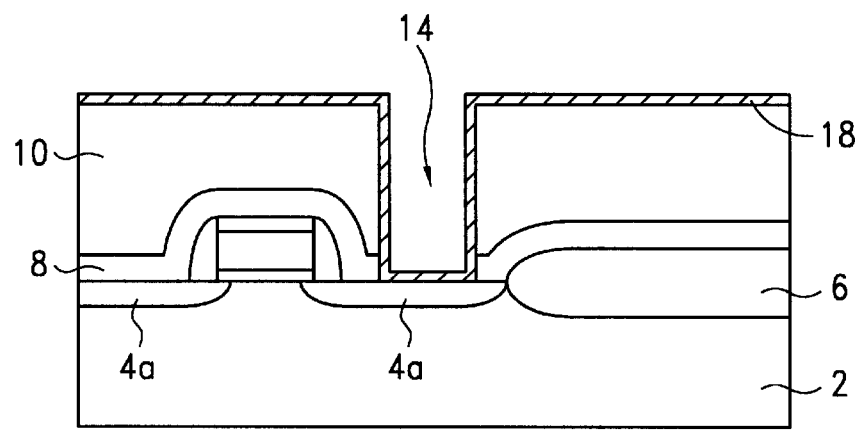
FIG. 6 is a cross-sectional view of a semiconductor wafer illustrating the step of performing RTP in accordance with the present invention.
Figure 7:
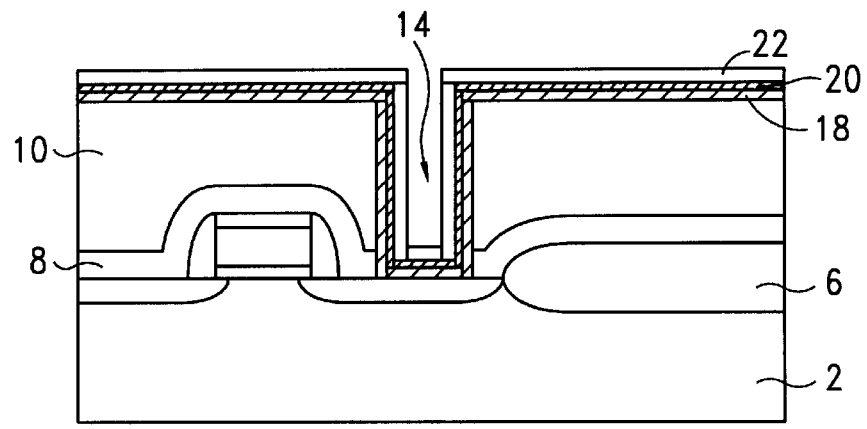
FIG. 7 is a cross-sectional view of a semiconductor wafer illustrating the step of forming barrier metal in accordance with the present invention.
Figure 8:
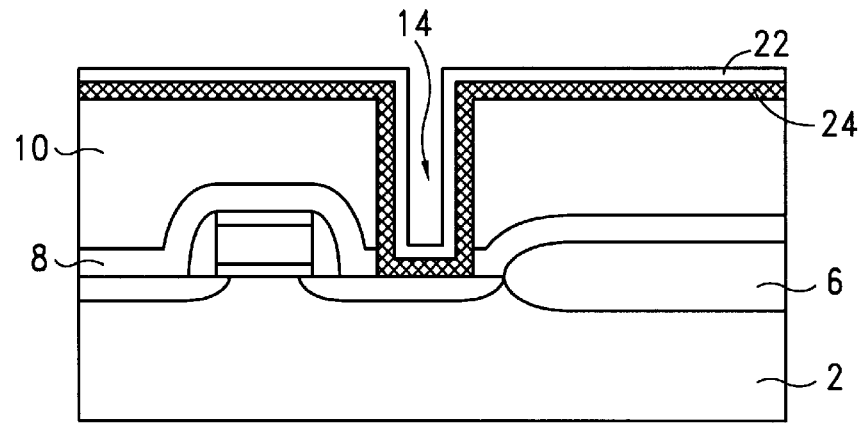
FIG. 8 is a cross-sectional view of a semiconductor wafer illustrating the step of performing RTP in accordance with the present invention.

Next, a high temperature anneal is used to recover the etching damage and simultaneously transform or convert the amorphous silicon 16 into a polysilicon layer 18, as shown in FIG. 6. The thermal process is performed at a temperature about 800 to 1050 degrees centigrade. Referring to FIG. 7, a titanium layer 20 with about 100 to 1000 angstroms and 200 to 1000 angstroms of titanium nitride 22 are respectively formed onto the polysilicon layer 18. The layers can be formed by using rf sputtering to act as barrier metal. It can be appreciated that any suitable method can be used to form the barrier metal. Next, rapid thermal process (RTP) is introduced to react the titanium 20 with the polysilicon layer 18, thereby forming a titanium silicide 24 beneath the titanium nitride layer 22, as shown in FIG. 8. The temperature of the RTP is about 650 to 750 degrees centigrade.

Figure 9:
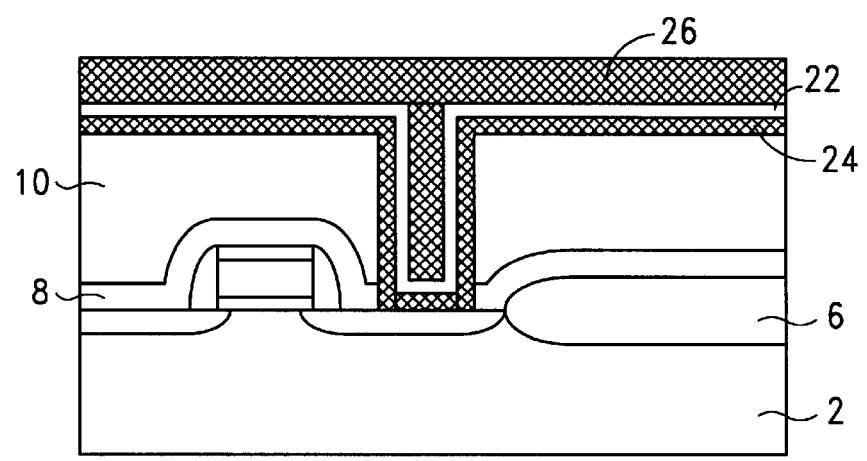
FIG. 9 is a cross-sectional view of a semiconductor wafer illustrating the step of forming a tungsten layer in accordance with the present invention.
Figure 10:
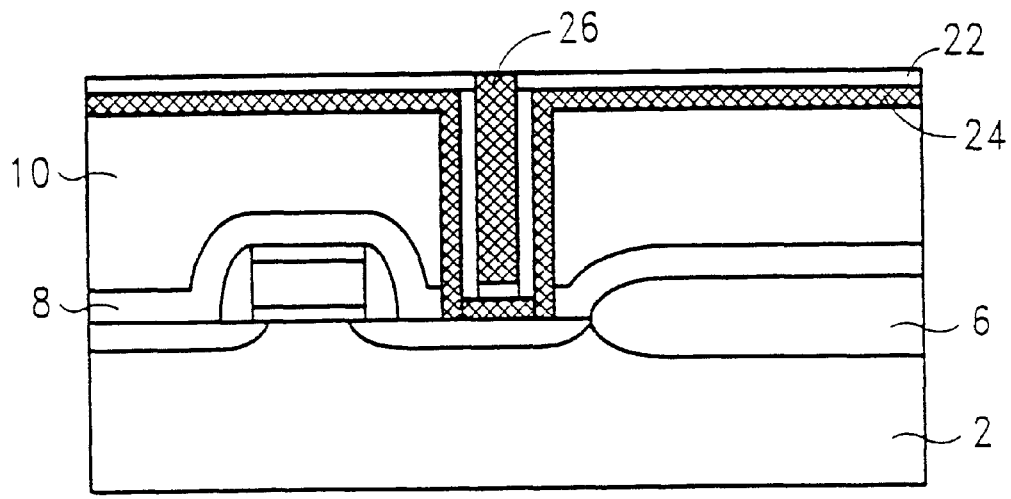
FIG. 10 is a cross-sectional view of a semiconductor wafer illustrating the step of removing a portion of the tungsten layer in accordance with the present invention.
Figure 11:
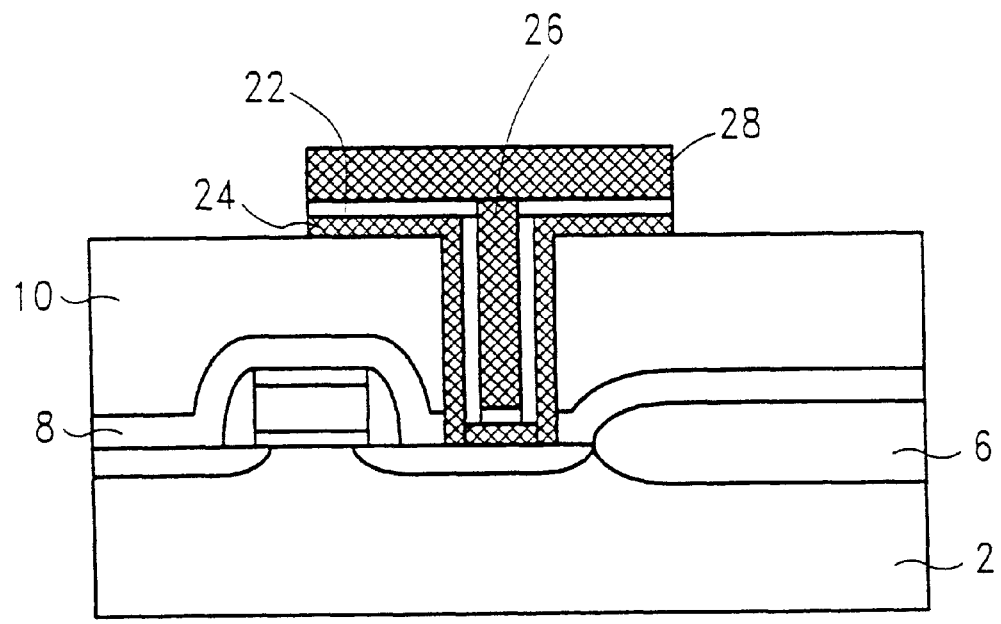
FIG. 11 is a cross-sectional view of a semiconductor wafer illustrating the step of forming a metal line in accordance with the present invention.

As shown in FIG. 9, a tungsten layer 26 is formed on the titanium nitride layer 22 and refilled into the contact hole 14 by using the tungsten hexafluoride and hydrogen. Preferably, this procedure can be completed by chemical vapor deposition reactor between 350 to 650 degrees centigrade. Turning to FIG. 10, the top portion of the CVD tungsten layer 26 is then removed to expose the titanium nitride layer 22, thereby forming a tungsten plug with void-free in the contact hole 14. Preferably, this can be obtained by dry etching or CMP (chemical mechanical polishing). A layer 28 of conductive material having low resistivity is formed on the titanium nitride layer 22. Referring to FIG. 11, a layer 28 can be chosen from aluminum, copper, alloy or the like. The titanium silicide 24, titanium nitride layer 22 and the conductive layer 28 are patterned to define a metal line.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a tungsten plug interconnections for integrated circuits, said method comprising the steps of:

forming an undoped oxide layer on a substrate for isolation;

forming a doped oxide layer on said undoped oxide layer;

performing a first thermal process to re-flow said doped oxide layer;

etching away a portion of said doped oxide layer and said undoped oxide layer to expose an active region in said substrate so as to form a contact hole;

forming an amorphous silicon layer on said doped oxide layer and on a surface of said contact hole;

performing a second thermal process to recover the etching damage and transforming or converting said amorphous silicon layer into a polysilicon layer;

forming a titanium layer on said polysilicon layer;

forming a titanium nitride layer on said titanium layer;

performing a third thermal process to react said polysilicon layer with said titanium layer, thereby generating a titanium silicide layer beneath said titanium nitride layer;

forming a tungsten layer on said titanium nitride layer and refilling into said contact hole; and removing a portion of said tungsten layer to expose said titanium nitride layer thereby forming said tungsten plug.

2. The method of claim 1, further comprising following step after forming said tungsten plug:

forming a conductive layer on said titanium nitride layer; and patterning said conductive layer, said titanium nitride layer and said titanium silicide layer to define a metal line.

3. The method of claim 2, wherein said conductive layer comprises aluminum.

4. The method of claim 2, wherein said conductive layer comprises copper.

5. The method of claim 1, wherein said undoped oxide layer comprises TEOS-oxide.

6. The method of claim 1, wherein said undoped oxide layer comprises nondoped silicon glass.

7. The method of claim 1, wherein said doped oxide layer comprises BPSG.

8. The method of claim 1, wherein said first thermal process is performed at a temperature about 750 to 1000 degrees centigrade.

9. The method of claim 1, wherein said second thermal process is performed at a temperature about 800 to 1050 degrees centigrade.

10. The method of claim 1, wherein said third thermal process is performed at a temperature about 650 to 750 degrees centigrade.

11. The method of claim 1, wherein said amorphous silicon layer is formed to have a thickness about 10 to 50 nm.

12. A method for manufacturing a tungsten plug for integrated circuits, said method comprising the steps of:

provided a substrate having a gate structure, source/drain region, and being encapsulated with an undoped oxide layer thereon;

forming a doped oxide layer on said undoped oxide layer;

etching said doped oxide layer, said undoped oxide layer to form a contact hole, exposing said source/drain region;

forming an amorphous silicon layer on said doped oxide layer and on a surface of said contact hole;

performing a thermal process to recover the etching damage and transforming or converting said amorphous silicon layer into a polysilicon layer;

forming a titanium layer on said polysilicon layer;

forming a titanium nitride layer on said titanium layer;

reacting said polysilicon layer with said titanium layer to generate a titanium silicide layer beneath said titanium nitride layer;

forming said tungsten plug in said contact hole.

13. The method of claim 12, wherein said undoped oxide layer comprises TEOS-oxide.

14. The method of claim 12, wherein said undoped oxide layer comprises nondoped silicon glass.

15. The method of claim 12, wherein said doped oxide layer comprises BPSG.

16. The method of claim 12, wherein said thermal process is performed at a temperature about 800 to 1050 degrees centigrade.

17. The method of claim 12, wherein said amorphous silicon layer is formed to have a thickness about 10 to 50 nm.

* * * * *